(12) United States Patent
Hamidian et al.

(10) Patent No.: US 10,742,195 B2
(45) Date of Patent: Aug. 11, 2020

(54) MATCHING CIRCUIT

(71) Applicant: NXP B.V., Eindhoven (NL)

(72) Inventors: Amin Hamidian, Nijmegen (NL); Gian Hoogzaad, Mook (NL); Ivan Mitkov Zahariev, Nijmegen (NL)

(73) Assignee: NXP B.V., Eindhoven (NL)

( * ) Notice: Subject to any disclaimer, the term of this patent is extended or adjusted under 35 U.S.C. 154(b) by 65 days.

(21) Appl. No.: 16/210,468

(22) Filed: Dec. 5, 2018

(65) Prior Publication Data

US 2019/0181840 A1  Jun. 13, 2019

(30) Foreign Application Priority Data

Dec. 8, 2017 (EP) .................................... 17206265

(51) Int. Cl.
*H03H 11/30* (2006.01)
*H03F 3/189* (2006.01)
*H03F 1/56* (2006.01)
*H03F 3/195* (2006.01)
*H03G 1/00* (2006.01)

(52) U.S. Cl.
CPC ............... *H03H 11/30* (2013.01); *H03F 1/56* (2013.01); *H03F 3/189* (2013.01); *H03F 3/195* (2013.01); *H03G 1/0088* (2013.01); *H03F 2200/294* (2013.01)

(58) Field of Classification Search
CPC . H03H 11/30; H03F 1/56; H03F 3/189; H03F 3/195

USPC .......................................................... 333/32
See application file for complete search history.

(56) References Cited

U.S. PATENT DOCUMENTS

| | | | |
|---|---|---|---|
| 4,236,126 A * | 11/1980 | Weller | H03H 7/255 327/308 |
| 4,943,783 A | 7/1990 | Nojima | |
| 5,392,463 A | 2/1995 | Yamada | |
| 9,276,550 B2 | 3/2016 | Washimori | |
| 2005/0024135 A1 | 2/2005 | Lin et al. | |
| 2010/0225411 A1 | 9/2010 | Maier | |
| 2019/0180986 A1* | 6/2019 | Torii | H01L 21/3065 |

FOREIGN PATENT DOCUMENTS

JP          H09246633 A          9/1997

* cited by examiner

*Primary Examiner* — Samuel S Outten

(57) ABSTRACT

A matching circuit comprising: an input-terminal configured to be connected to an active-circuit; an output-terminal configured to be connected to a downstream component; a current-source configured to provide a disabled-current; one or more diode-modules, each comprising a diode and a biasing-resistor in parallel with each other; and a reactive-matching-component that has a reactive impedance. The current source is configured to pass the disabled-current through the one or more diode-modules and the reactive-matching-component when the matching circuit is in a disabled-mode of operation such that they contribute to the impedance of the matching circuit between the input-terminal and the output-terminal.

20 Claims, 6 Drawing Sheets

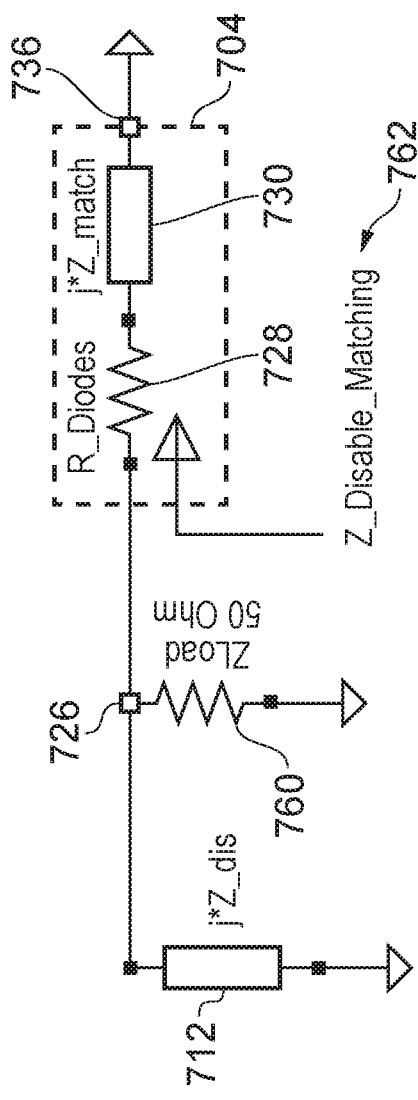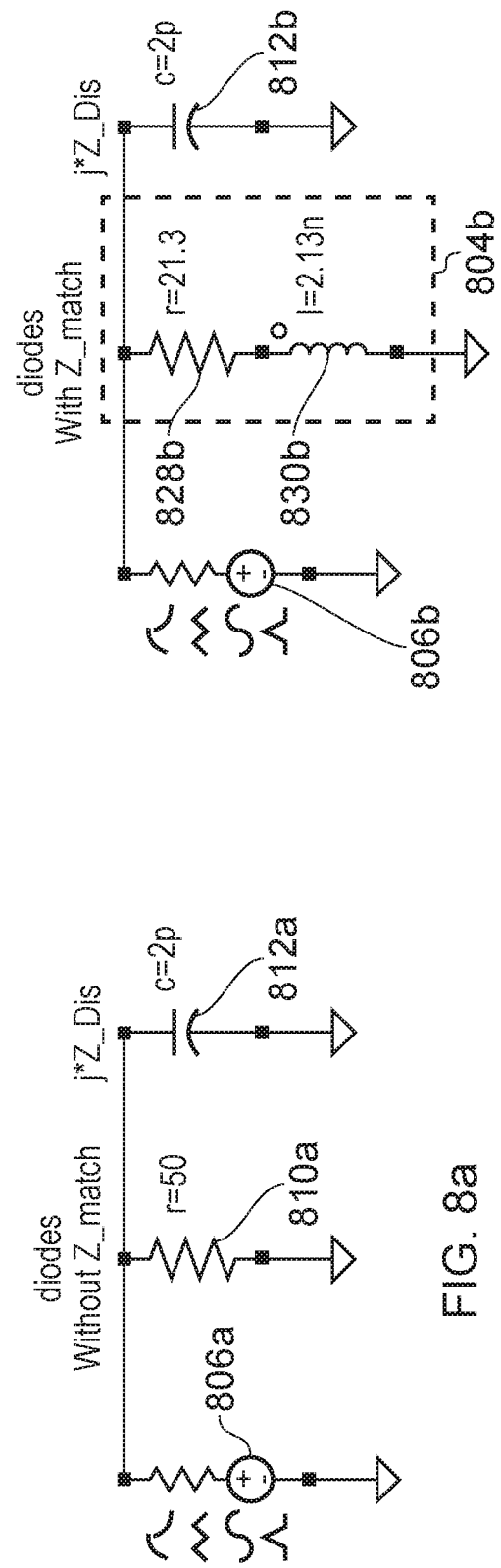

MATCHING CIRCUIT

CROSS-REFERENCE TO RELATED APPLICATIONS

This application claims the priority under 35 U.S.C. § 119 of European Patent application no. 17206265.5, filed on 8 Dec. 2017, the contents of which are incorporated by reference herein.

The present disclosure relates to matching circuits, and in particular to matching circuits that can be put in a disabled-mode of operation.

According to a first aspect of the present disclosure there is provided a matching circuit comprising:
- an input-terminal configured to be connected to an active-circuit;
- an output-terminal configured to be connected to a downstream component;
- a current-source configured to provide a disabled-current;
- one or more diode-modules, each comprising a diode and a biasing-resistor in parallel with each other; and
- a reactive-matching-component that has a reactive impedance;

wherein the current source is configured to pass the disabled-current through the one or more diode-modules and the reactive-matching-component when the matching circuit is in a disabled-mode of operation such that they contribute to the impedance of the matching circuit between the input-terminal and the output-terminal.

The reactive-matching-component can advantageously provide a reactive impedance to the matching circuit when it is in the disabled-mode of operation In one or more embodiments, the reactive-matching-component is configured to counteract a reactance at the output of the active-circuit, when the active-circuit is in a disabled-mode of operation.

In one or more embodiments, the current-source is configured not to pass the disabled-current through the one or more diode-modules and the reactive-matching-component when the matching circuit is in an enabled-mode of operation.

In one or more embodiments, the matching circuit is configured to receive a disable-control-signal, which is indicative of whether or not the matching circuit is to be in the disabled-mode or the enabled-mode. The current-source may be configured to selectively provide the disabled-current based on the disable-control-signal.

In one or more embodiments, the matching circuit further comprises a disable-activation-switch. The disable-activation-switch may be configured to selectively couple the current-source to the one or more diode-modules and the reactive-matching-component based on the disable-control-signal.

In one or more embodiments, the one or more diode-modules are provided in series with each other in a string. Each diode-module may include a diode and a biasing-resistor in parallel with each other.

In one or more embodiments, the matching circuit further comprises a supply-terminal configured to receive a supply-voltage; and a first-diode. The input-terminal may be connected to the output-terminal. The first-diode and the one or more diode-modules may be connected in series between the output-terminal and the supply-terminal.

In one or more embodiments, the first-diode and the one or more diode-modules are connected in series with each other between the output-terminal and the supply-terminal, each with the same polarity between the output-terminal and the supply-terminal.

In one or more embodiments, the diode modules are reverse biased when the matching circuit is in an enabled-mode of operation. The diode modules may be forward biased when the matching circuit is in the disabled-mode of operation.

In one or more embodiments, the first diode is reverse biased when the matching circuit is in both (i) the disabled-mode of operation, and (ii) an enabled-mode of operation.

In one or more embodiments, the first-diode is connected between the supply-terminal and a disabled-current-injection-node. The one or more diode-modules may be connected in series between the disabled-current-injection-node and the output-terminal. The current-source may be connected between the disabled-current-injection-node and a reference-terminal. The reactive-matching-component may be connected between the disabled-current-injection-node and the reference-terminal in parallel with the current-source.

In one or more embodiments, the cathode of the first-diode is connected to the supply-terminal. The anode of the first-diode may be connected to the disabled-current-injection-node. The anode of the diode in a first diode-module may be connected to the output-terminal. The cathode of the diode in a last diode-module may be connected to the disabled-current-injection-node.

In one or more embodiments, the matching circuit may further comprise a disable-activation-switch. The disable-activation-switch: may be connected in series with the current-source, between the disabled-current-injection-node and a reference-terminal; and may be configured to selectively couple the current-source to the one or more diode-modules and the reactive-matching-component based on a disable-control-signal.

In one or more embodiments, the input-terminal is connected to the output-terminal through an output-DC-blocking-capacitor.

There may be provided an integrated circuit comprising any matching circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 1 shows a system that includes an active circuit and a matching circuit;

FIG. 2*a* shows an amplifier, a downstream component and a matching circuit;

FIG. 2*b* shows the circuit of FIG. 2*a* where the output impedance of the amplifier is capacitive, when the amplifier is in the disabled condition;

FIG. 7 shows a simplified drawing of the system of FIG. 6, when the matching circuit is in the disabled mode of operation;

FIGS. 8a and 8b show systems for high frequency matching with a downstream component.

Figure 1:
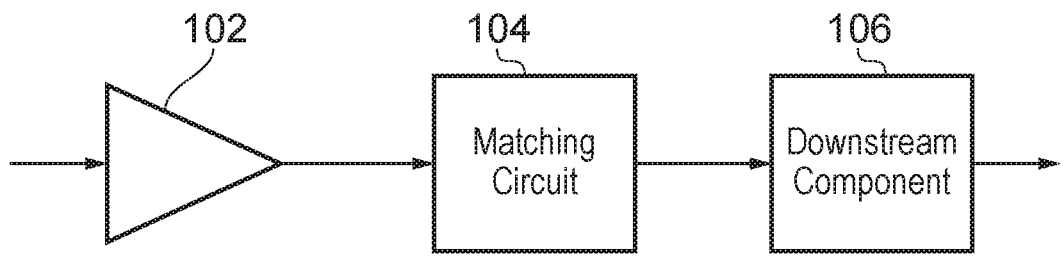

FIG. 1 shows a system that includes an active circuit, which in this example is a low noise amplifier (LNA) 102. In other examples the active circuit may be a mixer or an oscillator, as non-limiting examples, and can be considered as behaving like a power source for downstream components. FIG. 1 also shows a downstream component 106, which can be a mixer or any active or passive component. The system of FIG. 1 can be used in any application in which a desired impedance under disabled condition is beneficial.

A matching circuit 104 is connected to the LNA 102 and the downstream component 106. The matching circuit 104 is configured to improve the impedance matching between the LNA 102 and the downstream component 106. It can be advantageous to be able to disable the LNA 102, for instance so that it does not consume current, in such a way that it still presents a desired impedance to the downstream component 106. For example, it can be beneficial for the downstream component 106 to still be presented with a desired input impedance in order to reduce input reflections, such that more accurate calibration of the downstream component 106 can be performed when the LNA 102 is disabled.

In some of the following examples, the desired input/output impedance is 50Ω. However, it will be appreciated that in other applications the desired impedance may be different.

The system of FIG. 1 can be provided in cellular base stations, and the LNA 102 can be a wideband low noise amplifier (LNA) for Long-Term Evolution (LTE) carrier aggregation. In such applications, there can be requirements for a minimum output return loss over a whole band of operation in a disable mode of operation. The LNA 102 can be placed in the disable mode of operation by powering down an RF amplifier stage (not shown) of the LNA 102, which can be achieved by pulling down the base of a common emitter (CE) transistor, while the supply voltage Vcc equals 5V. In this case, the RF transistors do not draw any significant current. By reducing/minimising output return losses when the LNA 102 is in the disable mode of operation, more accurate calibration of the downstream component 106 (and any other consecutive stages) can be achieved.

Figure 2A:
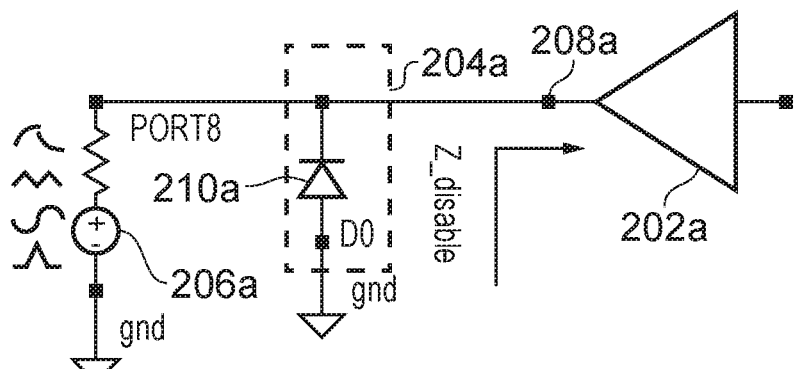
FIG. 2c shows the circuit of FIG. 2b, where the diode is turned on and therefore can be modelled as a resistor.

FIG. 2a shows an amplifier 202a, a downstream component 206a and a matching circuit 204a. The matching circuit 204a includes a diode 210a. The diode 210a is connected between an amplifier-output-terminal 208a of the amplifier 202a and a reference terminal (ground in this example). The amplifier 202a can be put in a disable mode of operation. The output impedance of the amplifier 202a when it is in the disable mode of operation is labelled as Z-disable in FIG. 2a.

The diode 210a can be used to match the output impedance (Z_disable) of the amplifier 202a in the disable condition to the input impedance of the downstream component 206a, which may be 50Ω. In this way, the diode 210a can provide the functionality of the matching circuit 204a. By carefully biasing the diode 210a when the amplifier 202a is in the disable condition, the required 50Ω impedance can be created. The impedance provided by the diode 210a is connected in parallel with the output impedance (Z_disable) of the amplifier 202a.

In other examples, a plurality of diodes 210a and/or one or more diode-connected transistors can be used in the matching circuit 204a.

In the case of a high output impedance of the amplifier 202a, the total impedance seen by the downstream component 206a would be equal to 50Ω. In practice, when the amplifier 202a is in the disabled condition, its output impedance (Z_disable) is high ohmic with some reactive parts. The reactive part of Z_disable can be either inductive or capacitive, depending on the output matching of the amplifier 202a and the nature of the transistor within the amplifier 202a that is under disable condition.

Figure 2B:
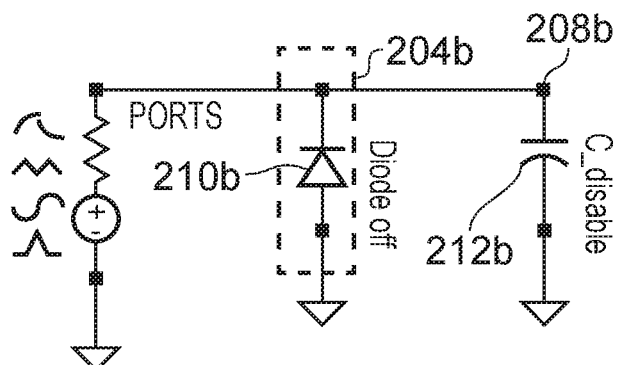

FIG. 2b shows the circuit of FIG. 2a where the output impedance (Z_disable) of the amplifier is capacitive, when the amplifier is in the disabled condition. The output impedance (Z_disable) is modelled as a capacitor (C_disable) 212b connected between the amplifier-output-terminal 208b and ground.

Figure 2C:
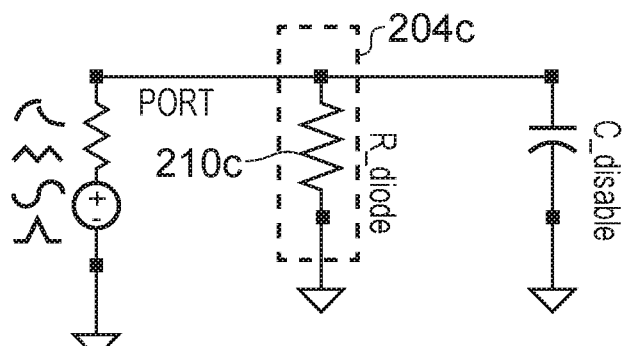

FIG. 2c shows the circuit of FIG. 2b, where the diode is turned on and therefore can be modelled as a resistor 210c (R_diode). That is, when the diode is turned on, a small signal resistance of 50Ω (R_diode) will be added in parallel with the output impedance (C_disable) of the amplifier.

Figure 3:
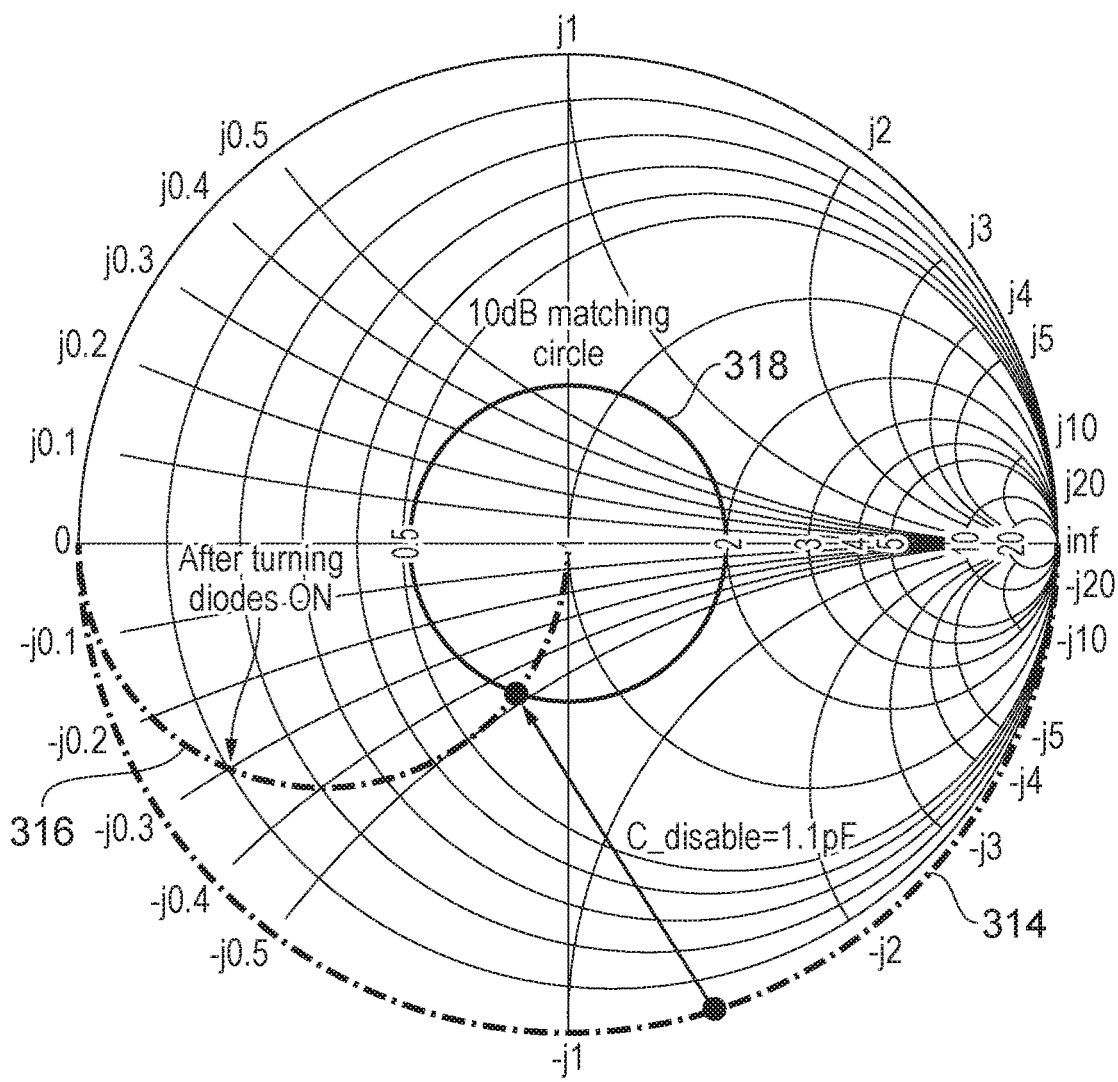
FIG. 3 shows a Smith Chart, that illustrates the output impedance of the network formed by the diode and Z_disable of FIGS. 2b and 2c.

FIG. 3 shows a Smith Chart, that illustrates the output impedance of the network formed by the diode and Z_disable of FIGS. 2b and 2c versus Z_disable at 2 GHz. In this example Z_disable is capacitive: C_disable. The output impedance, when the diode is off, is shown by a curve 314 that is entirely reactive, and therefore extends around the perimeter of the Smith Chart such that it represents only imaginary values (that is, with a real component that is zero). The output impedance, when the diode is on, is shown by a curve 316 that includes an imaginary and a real component. A circle 318 is also shown that represents 10 dB matching with a 50Ω impedance: that is, any impedances that are within the circle 318 are matched at 10 dB or better.

As shown by the curve 316 for when the diode is on, at lower C_disable values (less than 1.1 pF) a matching with 10 dB return loss can be expected from the circuit at 2 GHz. However, in order to achieve 20 dB matching the value of C_disable can only be as high as 300 fF. The turned-on diode provides 50Ω to the output impedance of the network of the circuit in disable mode, as shown by curve 316. However, this solution cannot provide any reactive matching.

Figure 4:
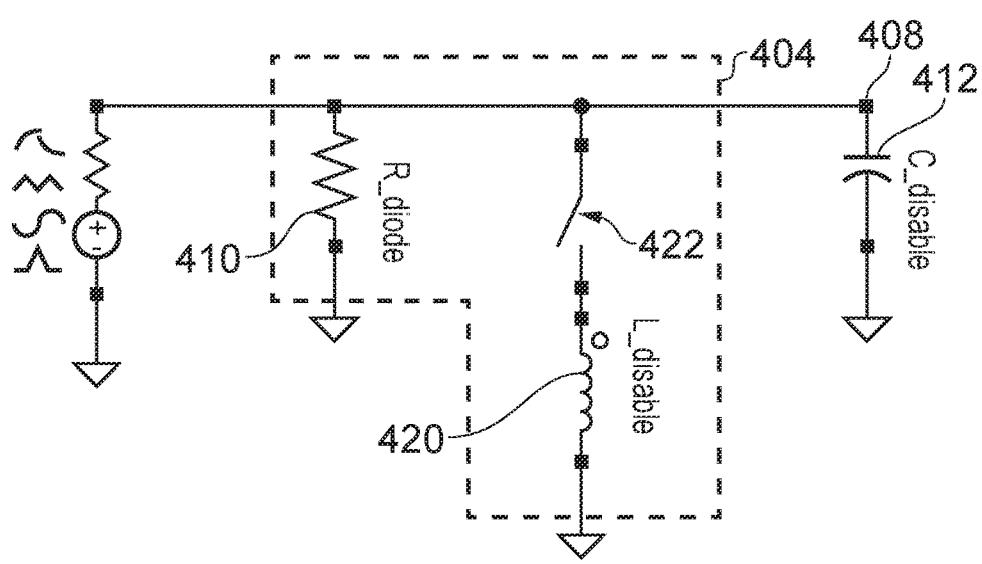
FIG. 4 shows a system that is similar to that of FIG. 2c, and additionally includes a reactive-matching-component.

FIG. 4 shows a system that is similar to that of FIG. 2c, and additionally includes a reactive-matching-component and a disable-activation-switch 422. The reactive-matching-component has a reactive impedance, which can be capacitive or inductive. In this example, since the output impedance (Z_disable) of the amplifier is capacitive (C_disable) 412, the reactive-matching-component is an inductive-matching-component L_disable 420. The inductive-matching-component L_disable 420 and the disable-activation-switch 422 are connected in series with each other between the amplifier-output-terminal 408 and ground. In this way, the inductive-matching-component L_disable 420 is in parallel with both: (i) the resistance R_diode 410 provided by the diode; and (ii) the capacitive output impedance C_disable 412 of the amplifier.

In this way, the disable-activation-switch 422 can be used to selectively include the inductive-matching-component L_disable 420 in the matching circuit 404 in order to "resonate out" the reactive part of Z_disable (C-disable in this example). That is, the inductive reactance of the inductive-matching-component L_disable 420 can at least partially cancel out the capacitive reactance of Z_disable. When the amplifier (not shown) is under disable condition, the disable-activation-switch 422 is turned on and the reactance of C_disable 412 (considering a capacitive Z_disable) of the disabled amplifier is resonated out by L_disable 420 at the desired frequency.

However, in some applications the disable-activation-switch 422 will have to tolerate a relatively high voltage such as 10 to 15V. Furthermore, the disable-activation-switch 422 should advantageously provide linear operation and low losses. These requirements of the disable-activation-switch 422, especially use with high voltages, may require an implementation of the switch that is unacceptably large. This is particularly the case where there are layout and/or space constraints on an integrated circuit, and/or where there is a desire not to have extra discrete components.

Figure 5:
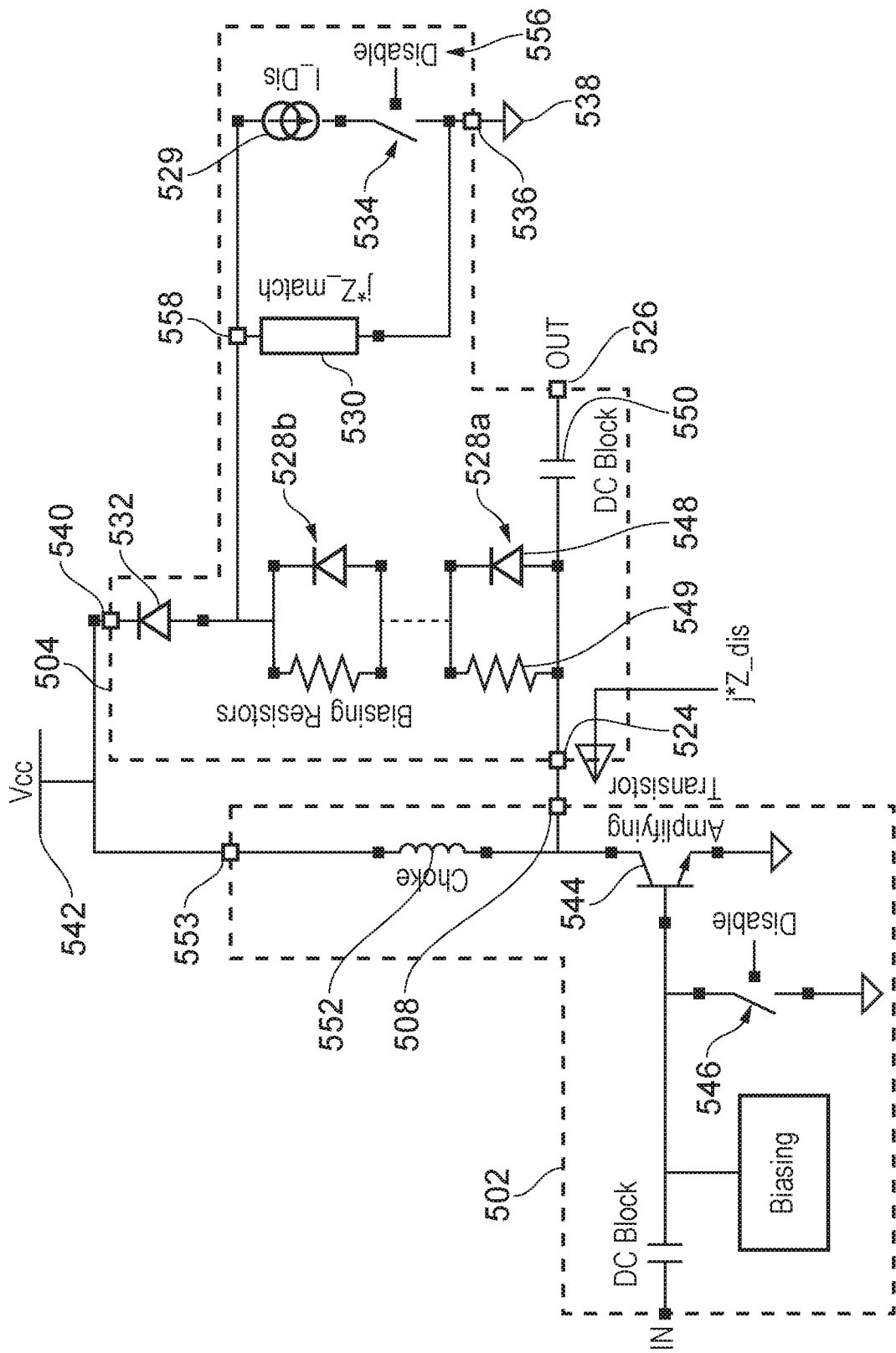
FIG. 5 shows an example embodiment of a system that includes an amplifier and a matching circuit.

FIG. 5 shows a system that includes an amplifier 502 and a matching circuit 504. The amplifier 502 is an example of an active circuit. The matching circuit 504 has an input-terminal 524 that is connected to an amplifier-output-terminal 508 of the amplifier 502. The matching circuit 504 also has an output-terminal 526 that can be connected to a downstream component (not shown). In this example, the input-terminal 524 is connected to the output-terminal 526 through an optional output-DC-blocking-capacitor 550. It will be appreciated that, in other embodiments, one or more additional or different components may be connected between the input-terminal 524 and the output-terminal 526, or the input-terminal 524 may be directly connected to the output-terminal 526.

The amplifier 502 includes an amplifying transistor 544 and an amplifier-disable-switch 546. The amplifier 502 can be put in an amplifier-disabled-mode of operation by closing the amplifier-disable-switch 546, such that the base of the amplifying transistor 544 is connected to ground. Hence, the collector of the amplifying transistor 544 draws no significant current, and the impedance seen at the amplifier-output-terminal 508 of the amplifier 502 is purely reactive (j*Z_dis). The amplifier 502 also includes a choke/inductor 552, which is connected between: (i) the collector of the amplifying transistor 544; and (ii) an amplifier-supply-terminal 553.

The matching circuit 504 includes a current-source 529 that can provide a disabled-current (I_Dis) and also one or more diode-modules 528a, 528b. The one or more diode-modules 528a, 528b are provided in series with each other in a string. Each diode-module 528a, 528b includes a diode 548 in parallel with a biasing-resistor 549. The matching circuit 504 also includes a reactive-matching-component 530 (j*Z_match). As will be described in more detail below, the current source 529 can pass the disabled-current (I_Dis) through the one or more diode-modules 528a, 528b and the reactive-matching-component 530 (j*Z_match) when the matching circuit 504 is in a disabled-mode of operation such that they contribute to the impedance of the matching circuit 504 between the input-terminal 524 and the output-terminal 526. In this way, the reactive-matching-component 530 (j*Z_match) can counteract the reactance (j*Z_dis) at the output of the amplifier 502, when the amplifier 502 is in the amplifier-disabled-mode of operation.

When the matching circuit 504 is in an enabled-mode of operation, the current-source 529 does not pass the disabled-current (I_Dis) through the diode-modules 528a, 528b and the reactive-matching-component 530 (j*Z_match).

In this example, the matching circuit 504 receives a disable-control-signal 556, which is indicative of whether or not the matching circuit 504 is to be in the disabled-mode or the enabled-mode of operation. The current-source 529 is configured to selectively provide the disabled-current (I_Dis) based on the disable-control-signal 556.

In FIG. 5, the matching circuit 504 can be put in the disabled-mode of operation by closing a disable-activation-switch 534. When the disable-activation-switch 534 is open, the matching circuit 504 is in the enabled-mode of operation. The disable-activation-switch is connected in series with the current-source 529, between a disabled-current-injection-node 558 and a reference-terminal 536. The disabled-current-injection-node 558 is connected to the diode-modules 528a, 528b and the reactive-matching-component 530 (j*Z_match). In this example the reference-terminal 536 is connected to ground 538. In this way, the disable-activation-switch 534 can selectively couple the current-source 529 to the one or more diode-modules 528a, 528b and the reactive-matching-component 530 (j*Z_match) based on the disable-control-signal 556. In the implementation of FIG. 5, the same disable-control-signal 556 is provided to the amplifier-disable-switch 546 in order to disable the amplifier 502.

In other examples, the matching circuit 504 can be put in the disabled-mode of operation by controlling the current-source 529 based on the state of the disable-control-signal 556, for example by switching it on or switching it off. In which case, the disable-activation-switch 534 may not be required, and the current-source 529 can be connected directly between the disabled-current-injection-node 558 and the reference-terminal 536.

As indicated above, the matching circuit 504 includes a disabled-current-injection-node 558. This node is used to inject the disabled-current (I_Dis) to the diode-modules 528a, 528b and the reactive-matching-component 530 (j*Z_match) when the matching circuit 504 is in the disabled-mode of operation.

The reactive-matching-component 530 (j*Z_match) is connected between the disabled-current-injection-node 558 and the reference-terminal 536, such that it is in parallel with the current-source 528. The reactive-matching-component 530 (j*Z_match) can be a reactive-matching-inductor or a reactive-matching-capacitor, depending upon whether the impedance (j*Z_dis) seen at the amplifier-output-terminal 508 is capacitive or inductive respectively.

The matching circuit 504 includes a supply-terminal 540 that can receive a supply-voltage Vcc 542. In this example, the matching circuit 504 also includes a first-diode 532. The first-diode 532 is connected between the supply-terminal 540 and the disabled-current-injection-node 558. As shown in FIG. 5, the cathode of the first-diode 532 is connected to the supply-terminal 540, and the anode of the first-diode 532 is connected to the disabled-current-injection-node 558. The one or more diode-modules 528a, 528b are connected in series with each other between the disabled-current-injection-node 558 and the output-terminal 526. The anode of the diode 548 in a first diode-module 528a is connected to the output-terminal 526 (in this example through the optional output-DC-blocking-capacitor 550). The cathode of the diode in a last diode-module 528b is connected to the disabled-current-injection-node 558.

In this way, the first-diode 532 and the one or more diode-modules 528 are connected in series with each other between the output-terminal 526 and the supply-terminal 540, each with the same polarity between the output-terminal 526 and the supply-terminal 540. The first-diode 532 and the diode-modules 528 can be considered together as a diode string. In this example, the optional output-DC-blocking-capacitor 550 is also included in series with the diode-modules 528 between the disabled-current-injection-node 558 and the output-terminal 526.

The first-diode 532 and the diode-modules 528 are located between: (i) the collector of the amplifying transistor 544 (via the input-terminal 524); and (ii) the supply-voltage Vcc 542 (via the supply-terminal 540). This can enable the DC voltage at both sides of the diodes 532, 528 to be determined and to be equal to the supply voltage Vcc 542. Therefore, the voltage difference across the diode string (defined by the first-diode 532 and the diode-modules 528) is close to zero (depending on the voltage drop across the choke 552 of the amplifier 502). The biasing-resistors 549 of the diode-modules 528 can provide a fixed and equal DC voltage potential at the anode and cathode terminals of the diodes 548 in the diode-modules 528 when the matching circuit is in the enabled-mode of operation. Therefore, the diodes 548 can be fully off because they are reverse biased when the matching circuit is in the enabled-mode of operation. Even if a minor leakage current is drawn in the enabled-mode, for example due to a non-ideally switched-off current source 529, any disabled-current (I_Dis) will flow through the biasing-resistors 549. Therefore, the diodes 548 of the diode-modules 528 can remain in an off state, and the PN junctions of the diodes will not exhibit any significant nonlinearity at the amplifier-output-terminal 508.

In this way, the diodes 548 of the diode-modules 528: are reverse biased when the matching circuit 504 is in the enabled-mode of operation; and are forward biased when the matching circuit 504 is in the disabled-mode of operation. Whereas, the first diode 532 is reverse biased when the matching circuit is in both: the disabled-mode of operation, and the enabled-mode of operation.

The value of the biasing-resistors 549 can be selected as large as possible to minimize their effect on the RF performance of the circuit. As will be described below with reference to FIG. 6, the diodes 548 of the diode-modules 528 (which may be referred to as the N−1 series diodes (D0, D1 . . . DN−1), where N is the number of diodes connected between the supply-terminal 540 and the output-terminal 526) are utilized to generate the 50Ω in the disabled-mode of operation. The first-diode 532 (which may be referred to as Diode DN) blocks the switchable disabled-current (I_Dis) from the supply voltage Vcc 542. The complete diode string (D0 to DN) can also be used for electrostatic discharge (ESD) protection.

Figure 6:
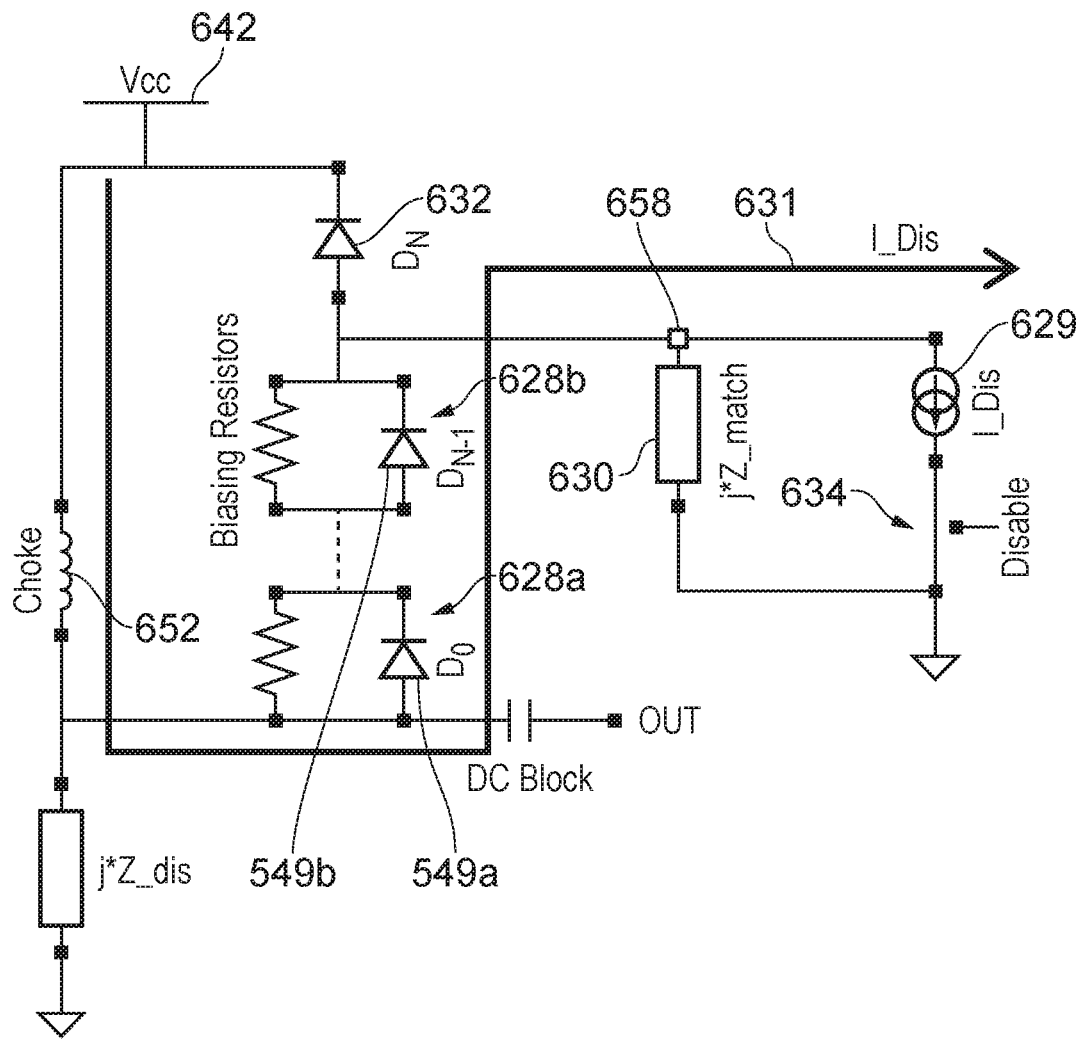
FIG. 6 shows the system of FIG. 5 when the matching circuit and the amplifier are in disabled-modes of operation.

FIG. 6 shows the system of FIG. 5 when the matching circuit and the amplifier are in disabled-modes of operation. Features of FIG. 6 that are shown in FIG. 5 have been corresponding reference numbers in the 600 series, and will not necessarily be described again here.

As shown in FIG. 6, when the matching circuit is in the disabled-mode of operation because the disable-activation-switch 634 is closed. The current-source 629 provides the disabled-current I_Dis 631 for the disable circuitry. Under this condition, the current source 529 draws the disabled-current I_Dis 631 from the supply-voltage Vcc 642 through the choke 652 and forward biases the diodes 548 of the diode-modules 628 (also referred to as the N−1 series diodes). The first-diode 632 (diode DN) is reverse biased and therefore is turned off. The turned-on diodes (N−1 series diodes) 548 act as an RF resistor, with a resistance that can be calculated from:

$$R\_Diodes = \frac{(N-1) \times V_T}{I\_Dis} \quad (1)$$

Where $V_T$ is the thermal voltage of the diode, and may be about 25 mV.

In addition, the reactive-matching-component 630 (j*Z_match) advantageously provides a reactive impedance to the matching circuit when it is in the disabled-mode of operation. The disabled-current-injection-node 658 can be considered as a DC ground terminal when the matching circuit is in the disabled-mode of operation.

Beneficially, the disable-activation-switch 634 does not have to tolerate a high voltage because it is simply used to include or exclude the current-source 629 in the matching circuit. Therefore, a small, low-quality switch can be used that may not have unacceptable requirements in terms of space on an integrated circuit, for example.

FIG. 7 shows a simplified drawing of the system of FIG. 6, when the matching circuit is in the disabled mode of operation. The resistance of the diode-modules is modelled as a single resistor: R_Diodes 728. This resistor, R_Diodes 728, along with the reactive-matching-component j*Z_match 730 can be referred to as disable circuitry 704.

In FIG. 7, ZLoad 760 is the load impedance of the amplifier (50Ω). As the current source and the first-diode (DN diode) are open circuit at RF frequencies, they are not shown in FIG. 7. In this case, for best matching, the matching-circuit-impedance in disabled mode (Z_Disable_Matching) 762 should match the impedance of the disabled amplifier (j*Z_Dis 712) plus the load impedance 760 (50Ω). To match to this impedance, the disable circuitry 704 should provide an impedance equal to 50Ω in parallel with j*Z_dis 712.

To be able to calculate the values for the resistor R_Diodes 728 and the reactive-matching-component j*Z_match 730 for the disable circuitry 704, first the quality factor of the matching network can be calculated:

$$Q = \frac{50}{Z\_dis} \quad (2)$$

By having the quality factor of the network, and by using the known series to parallel transformation formula, the values for R_Diodes 728 and Z_match 730 can be calculated:

$$Z_{match} = -Z\_dis \times \frac{Q^2}{1+Q^2} \text{ and } R\_Diodes = \frac{50\Omega}{1+Q^2} \quad (3)$$

FIGS. 8a and 8b show systems for high frequency matching with a downstream component 806a, 806b, that will be used to describe a benefit of using the reactive-matching-component j*Z_match of FIG. 7. FIGS. 8a and 8b illustrate an amplifier with a capacitive output impedance Z_Dis 812a, 812b that is represented by an output capacitance of 2 pF.

In FIG. 8a, Z_Dis 812a has been matched to the downstream component 806a with a string of diodes that are represented by 50Ω resistor 810a, without using a reactive-matching-component j*Z_match.

FIG. 8b represents the system of FIG. 7. A reactive-matching-inductor 830b is used as the reactive-matching-component (j*Z_match). Also, the resistance of the diode-modules of FIG. 5 is modelled as a single resistor 828b. The reactive-matching-inductor 830b and the resistor 828b together provide the disable circuitry/matching circuit 804b. The matching circuit 804 of FIG. 8b is matched for 1.8 GHz (which is suitable for a mid-band frequency division duplex LNA (FDDLNA) product), and the values of the resistor 828b and the reactive-matching-inductor 830b have been calculated accordingly as 21.3Ω and 2.13 nH.

Figure 9:
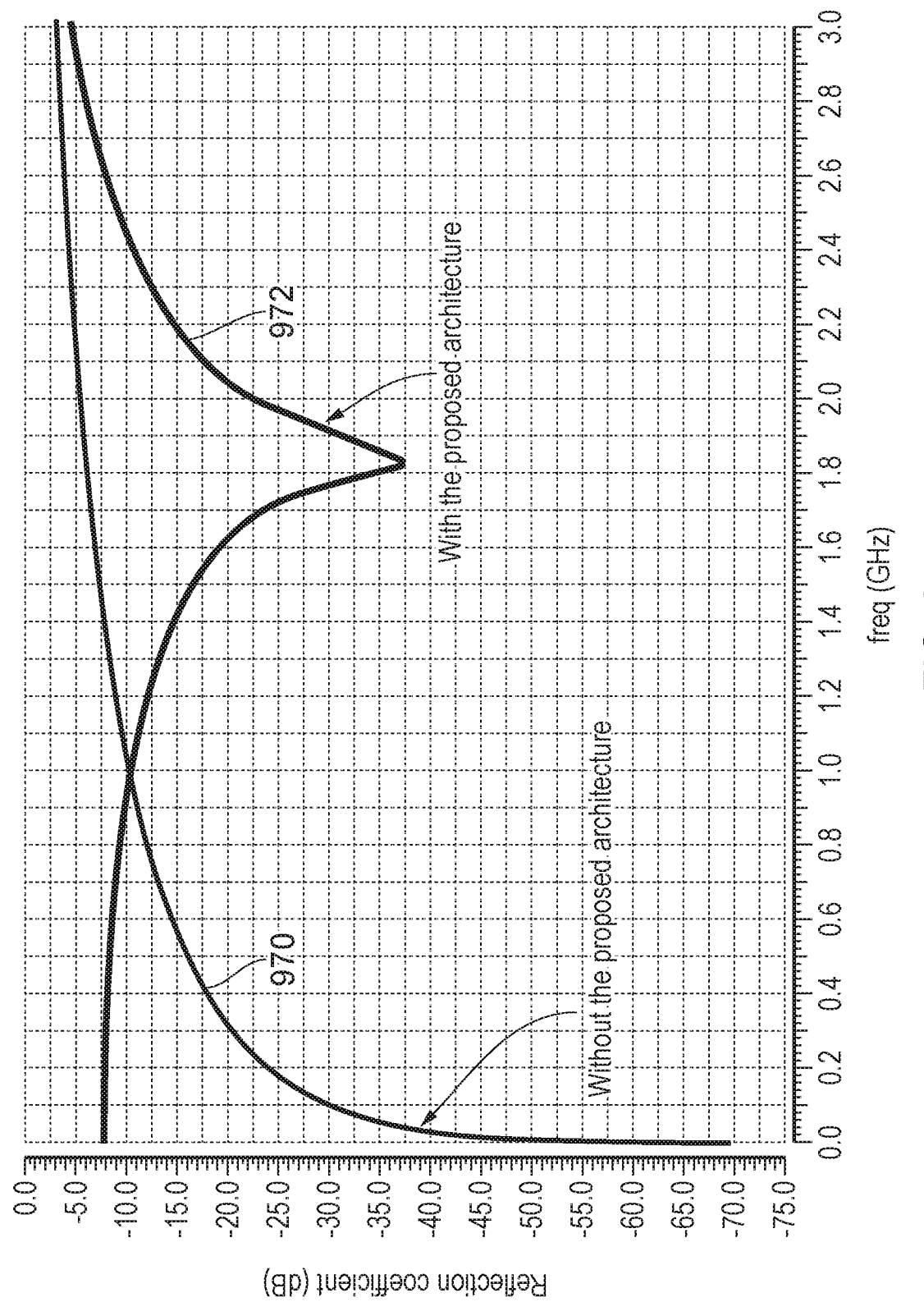
FIG. 9 shows a plot of reflection coefficient (dB) versus frequency for the systems of FIGS. 8a and 8b.

FIG. 9 shows a plot of reflection coefficient (dB) versus frequency for the systems of FIGS. 8a and 8b. The reflection coefficient (dB) represents the quality of the matching, where higher (more negative) values represent better matching.

A first plot 970 shows simulation results for the system of FIG. 8a, which does not include a reactive-matching-component. A second plot 972 shows simulation results for the system of FIG. 8b, which includes a reactive-matching-inductor.

The system of the first plot 970 achieves a matching of only about 6 dB output return loss at 1.8 GHz. In contrast, the system of the second plot 972 achieves wideband matching (of at least 10 dB) for a frequency band between 1 GHz and 2.4 GHz. The matching at 1.8 GHz for the second plot 972 is about 37 dB. Therefore, the system of FIG. 8b, represented by the second plot 972, provides improved high frequency matching for disable conditions.

One or more of the examples disclosed herein can be summarised as a disable matching circuitry consisting of one or more of:
  diodes (that can be implemented as diode-connected transistors/active rectifiers), which are used to contribute to a desired impedance to the matching circuitry;
  matching circuitry (which for first order matching, can include one inductor or one capacitor);
  a current source that can be switched on and off; and
  a supply and a ground connection.

Examples disclosed herein can address one or more of the following problems or disadvantages:
  matching problems for circuits in a disable mode with large reactive components;
  a requirement for extra circuitry, such as switches and a matching network at the output/input of the circuit, to reduce/resonate out the reactive parts which could add to:
  output/Input insertion loss,
  noise,
  bandwidth reduction, and/or
  gain slope deterioration;
  a requirement for extra digital circuitry and long wiring to turn on any switches at the output.

For example, low DC power consumption of the diode matching in disable mode can be achieved, which can be an important feature in disable condition. Advantageously diode matching can be fully in an off-state in the enable mode. Therefore, high impedance, zero/low DC power consumption, and no/reduced linearity distortion can be achieved by one or more of the examples disclosed herein.

One or more of the matching circuits disclosed herein can be used in RF and mm-wave applications (such as the 5G mobile telephony standard). More generally, any circuit that can benefit from impedance matching (including amplifiers, mixers, etc.) can use one or more of the matching circuits disclosed herein.

There is provided a circuit arrangement that can provide improved load matching under a circuit disable condition, which can increase the return loss of the circuit, decrease the reflection coefficient, and hence reduce/minimize its effect on the subsequent circuits in the system.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of 30o receiving and processing information from signals and/or other transient mediums.

Example embodiments of the material discussed in this specification can be implemented in whole or in part through network, computer, or data based devices and/or services. These may include cloud, Internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A matching circuit comprising:
   an input-terminal configured to be connected to an active-circuit;
   an output-terminal configured to be connected to a downstream component;
   a current-source configured to provide a disabled-current;
   one or more diode-modules, each comprising a diode and a biasing-resistor in parallel with each other; and
   a reactive-matching-component that has a reactive impedance;
   wherein the current source is configured to pass the disabled-current through the one or more diode-modules and the reactive-matching-component when the matching circuit is in a disabled-mode of operation such that they contribute to the impedance of the matching circuit between the input-terminal and the output-terminal.

2. The matching circuit of claim 1, further comprising:
   a supply-terminal configured to receive a supply-voltage; and
   a first-diode;
   wherein:
   the input-terminal is connected to the output-terminal;
   the first-diode and the one or more diode-modules are connected in series between the output-terminal and the supply-terminal.

3. The matching circuit of claim 2, wherein:
   the diode modules are reverse biased when the matching circuit is in an enabled-mode of operation; and
   the diode modules are forward biased when the matching circuit is in the disabled-mode of operation.

4. The matching circuit of claim 3, wherein the first diode is reverse biased when the matching circuit is in both (i) the disabled-mode of operation, and (ii) an enabled-mode of operation.

5. The matching circuit of claim 2, wherein:
   the first-diode is connected between the supply-terminal and a disabled-current-injection-node;
   the one or more diode-modules are connected in series between the disabled-current-injection-node and the output-terminal;
   the current-source is connected between the disabled-current-injection-node and a reference-terminal; and
   the reactive-matching-component is connected between the disabled-current-injection-node and the reference-terminal in parallel with the current-source.

6. The matching circuit of claim 5, wherein:
   the cathode of the first-diode is connected to the supply-terminal;
   the anode of the first-diode is connected to the disabled-current-injection-node;
   the anode of the diode in a first diode-module is connected to the output-terminal; and
   the cathode of the diode in a last diode-module is connected to the disabled-current-injection-node.

7. The matching circuit of claim 2, wherein the first-diode and the one or more diode-modules are connected in series with each other between the output-terminal and the supply-terminal, each with the same polarity between the output-terminal and the supply-terminal.

8. The matching circuit of claim 1, wherein the reactive-matching-component is configured to counteract a reactance at the output of the active-circuit, when the active-circuit is in a disabled-mode of operation.

9. The matching circuit of claim 8, wherein the current-source is configured not to pass the disabled-current through the one or more diode-modules and the reactive-matching-component when the matching circuit is in an enabled-mode of operation.

10. The matching circuit of claim 8, wherein:
    the matching circuit is configured to receive a disable-control-signal, which is indicative of whether or not the matching circuit is to be in the disabled-mode or the enabled-mode; and
    the current-source is configured to selectively provide the disabled-current based on the disable-control-signal.

11. The matching circuit of claim 8, wherein:
    the one or more diode-modules are provided in series with each other in a string; and
    each diode-module includes a diode and a biasing-resistor in parallel with each other.

12. The matching circuit of claim 8, further comprising:
    a supply-terminal configured to receive a supply-voltage; and
    a first-diode;
    wherein:
    the input-terminal is connected to the output-terminal;
    the first-diode and the one or more diode-modules are connected in series between the output-terminal and the supply-terminal.

13. The matching circuit of claim 8, further comprising a disable-activation-switch, wherein the disable-activation-switch:
    is connected in series with the current-source, between the disabled-current-injection-node and a reference-terminal; and
    is configured to selectively couple the current-source to the one or more diode-modules and the reactive-matching-component based on a disable-control-signal.

14. The matching circuit of claim 1, wherein:
    the matching circuit is configured to receive a disable-control-signal, which is indicative of whether or not the matching circuit is to be in the disabled-mode or the enabled-mode; and
    the current-source is configured to selectively provide the disabled-current based on the disable-control-signal.

15. The matching circuit of claim 14, further comprising a disable-activation-switch, wherein the disable-activation-switch is configured to selectively couple the current-source to the one or more diode-modules and the reactive-matching-component based on the disable-control-signal.

16. The matching circuit of claim 1, wherein the current-source is configured not to pass the disabled-current through the one or more diode-modules and the reactive-matching-component when the matching circuit is in an enabled-mode of operation.

17. The matching circuit of claim 1, wherein:
    the one or more diode-modules are provided in series with each other in a string; and
    each diode-module includes a diode and a biasing-resistor in parallel with each other.

18. The matching circuit of claim 1, further comprising a disable-activation-switch, wherein the disable-activation-switch:
    is connected in series with the current-source, between the disabled-current-injection-node and a reference-terminal; and
    is configured to selectively couple the current-source to the one or more diode-modules and the reactive-matching-component based on a disable-control-signal.

19. The matching circuit of claim 1, wherein the input-terminal is connected to the output-terminal through an output-DC-blocking-capacitor.

20. An integrated circuit comprising the matching circuit of claim 1.

* * * * *